(12) United States Patent
Kim et al.

(10) Patent No.: US 9,231,291 B2
(45) Date of Patent: Jan. 5, 2016

(54) ELECTROMAGNETIC BANDGAP STRUCTURE AND METHOD FOR MANUFACTURING ELECTROMAGNETIC BANDGAP STRUCTURE

(71) Applicant: Electronics and Telecommunications Research Institute, Daejeon (KR)

(72) Inventors: Myunghoi Kim, Daejeon (KR); Jin Ho Jo, Daejeon (KR); Jae Hoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 192 days.

(21) Appl. No.: 13/932,811

(22) Filed: Jul. 1, 2013

(65) Prior Publication Data
US 2014/0225681 A1 Aug. 14, 2014

(30) Foreign Application Priority Data
Feb. 14, 2013 (KR) .................. 10-2013-0015784

(51) Int. Cl.
*H04B 3/28* (2006.01)
*H01P 11/00* (2006.01)
*H01P 1/20* (2006.01)
*H05K 1/02* (2006.01)

(52) U.S. Cl.
CPC ............ *H01P 11/007* (2013.01); *H01P 1/2005* (2013.01); *H05K 1/0236* (2013.01); *H05K 2201/09309* (2013.01); *Y10T 29/4902* (2015.01)

(58) Field of Classification Search
CPC .... H01P 11/007; H01P 1/2005; H05K 1/0236
USPC .......................................................... 333/12
See application file for complete search history.

(56) References Cited

U.S. PATENT DOCUMENTS 7,215,301 B2 5/2007 Choi et al.
2006/0092093 A1* 5/2006 Choi et al. ................... 343/909

FOREIGN PATENT DOCUMENTS

KR 1020120019634 A 3/2012

OTHER PUBLICATIONS

Myunghoi Kim et al., "Vertical Stepped Impedance EBG (VSI-EBG) Structure for Wideband Suppression of Simultaneous Switching Noise in Multilayer PCBs," IEEE Transactions on Electromagnetic Capability, Sep. 20, 2012, pp. 8.

* cited by examiner

*Primary Examiner* — Robert Pascal
*Assistant Examiner* — Kimberly Glenn
(74) *Attorney, Agent, or Firm* — William Park & Associates Ltd.

(57) ABSTRACT

An electromagnetic bandgap structure is provided, which includes a ground layer; a first power layer facing an upper portion of the ground layer with a dielectric interposed and comprising at least one first patch and at least one first branch; and a second power layer facing an upper portion of the first power layer with a dielectric interposed and comprising at least one second patch and at least one second branch.

17 Claims, 6 Drawing Sheets

ELECTROMAGNETIC BANDGAP STRUCTURE AND METHOD FOR MANUFACTURING ELECTROMAGNETIC BANDGAP STRUCTURE

CROSS-REFERENCE TO RELATED APPLICATION

This application claims the benefit of Korean Patent Application No. 10-2013-0015784, filed on Feb. 14, 2013, in the Korean Intellectual Property Office, the disclosure of which is incorporated herein by reference.

BACKGROUND

1. Field of the Invention

The present invention relates to an electromagnetic bandgap (EBG) structure, and more particularly, to an EBG interrupting transmission of wideband noise and a manufacturing method thereof.

2. Description of the Related Art

Recently marketed multimedia devices are designed such that devices having various signal characteristics such as digital, analog, radio frequency (RF), and the like are combined on a single printed circuit board (PCB), so as to reduce size and weight of the multimedia devices.

In the multimedia devices, a noise induced from one device easily propagates to another device through the PCB being shared. According to an increase in an operation speed of the device and a transmission rate of signal lines, frequency characteristics of the propagated noise are becoming wideband.

The wideband noise may reduce a noise margin necessary for power stabilization of a digital device. Also, the wideband noise may increase undesired reduction in a signal amplitude, overshot, and jitter as being coupled with the signal lines. In case of an RF device, reception sensitivity may be reduced due to the wideband noise. An apparatus capable of covering frequency regions from a megahertz (MHz) band to a gigahertz (GHz) band is necessary to isolate such a wideband noise.

Conventional technologies for isolating the wideband noise is ineffective for size reduction and have a relatively narrow noise isolation frequency band. Therefore, an electromagnetic bandgap structure needs to be enlarged in order to reduce the noise isolation frequency band to the MHz band. To make the noise isolation frequency appropriate for a wideband, electromagnetic bandgap structures having different noise isolation frequencies need to be used in to combination, which may also increase the entire size. Accordingly, there is a desire for a minimized apparatus capable of a noise from the MHz band while having wideband noise characteristics.

SUMMARY

According to an aspect of the present invention, there is provided an electromagnetic bandgap structure including a ground layer; a first power layer facing an upper portion of the ground layer with a dielectric interposed and including at least one first patch and at least one first branch; and a second power layer facing an upper portion of the first power layer with a dielectric interposed and including at least one second patch and at least one second branch.

The at least one first patch and the at least one second patch may be provided in a square shape.

The at least one first branch and the at least one second branch may be provided in a rectangular shape.

The at least one first patch may be an impedance patch having a lowest characteristic impedance, and the at least one first branch may be an impedance branch having a lower characteristic impedance than the at least one second branch.

The at least one second patch may be an impedance patch having a highest characteristic impedance, and the at least one second branch may be an impedance branch having a higher characteristic impedance than the at least one first branch.

The at least one first patch and the at least one second patch may be vertically connected through a via.

The at least one first patch and the at least one second patch may be disposed not to overlap on a 2-dimensional (2D) plane which is perpendicular to the via.

The ground layer may include a clearance hole, and the via may be received in the clearance hole.

The at least one first patch and the at least one first branch may have different widths, and the at least one second patch and the at least one second branch may have different widths.

According to another aspect of the present invention, there is provided a printed circuit board (PCB) including an electromagnetic bandgap structure, the PCB including a ground layer; a first power layer facing an upper portion of the ground layer with a dielectric interposed and including at least one first patch and at least one first branch; and a second power layer facing an upper portion of the first power layer with a dielectric interposed and including at least one second patch and at least one second branch.

According to another aspect of the present invention, there is provided a method of manufacturing an electromagnetic bandgap structure, the method including forming a ground layer; forming a first power layer facing an upper portion of the ground layer with a dielectric interposed and including at least one first patch and at least one first branch; and forming a second power layer facing an upper portion of the first power layer with a dielectric interposed and including at least one second patch and at least one second branch.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Reference will now be made in detail to exemplary embodiments of the present invention, examples of which are illustrated in the accompanying drawings.

In the description of the present invention, if detailed descriptions of related disclosed art or configuration are determined to unnecessarily make the subject matter of the present invention obscure, they will be omitted. Terms to be used below are defined based on their functions in the present invention and may vary according to users, user's intentions, or practices. Therefore, the definitions of the terms should be determined based on the entire specification.

An embodiment of the present invention provides an electromagnetic bandgap structure satisfying a low noise isolation start frequency and wideband noise isolation characteristics and a printed circuit board (PCB) including the same.

The electromagnetic bandgap structure according to the embodiment of the present invention may face a power layer or a ground layer with a dielectric interposed, in a power distribution network (PDN) used for power supply in another multilayer PCB.

The power layer or ground layer may include patches periodically and alternately disposed in layers of the PCB. Patches disposed on different layers may be connected through vias. Patches disposed on a same layer may cause a change in a characteristic impedance through a change in size. The patches disposed on different layers may have different characteristic impedances through different distances to the ground layer.

Figure 1:
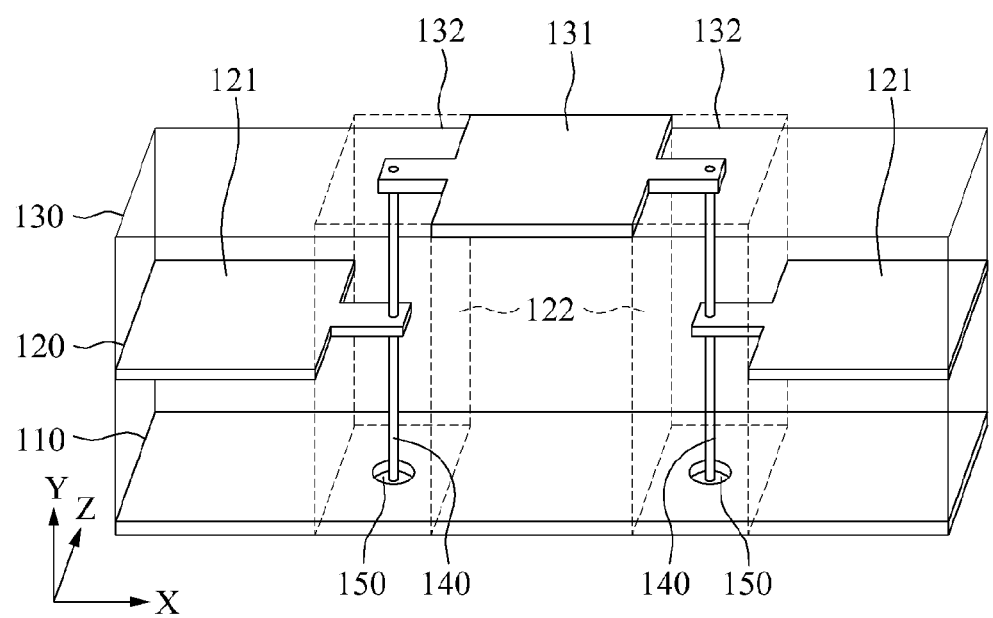
FIG. 1 is a diagram illustrating a configuration of an electromagnetic bandgap structure according to an embodiment of the present invention.

FIG. 1 is a diagram illustrating a configuration of an electromagnetic bandgap structure according to an embodiment of the present invention.

Referring to FIG. 1, the electromagnetic bandgap structure may include a ground layer 110, a first power layer 120 facing an upper portion of the ground layer 110 with a dielectric interposed and including at least one first patch 121 and at least one first branch 122, and a second power layer 130 facing an upper portion of the first power layer 120 with a dielectric interposed and including at least one second patch 131 and at least one second branch 132.

The at least one first patch 121 and the at least one second patch 131 may be provided in a square shape. The at least one first branch 122 and the at least one second branch 132 may be provided in a rectangular shape.

For example, the electromagnetic bandgap structure may include two power layers, that is, the first power 120 and the second power layer 130, and one ground layer, that is, the ground layer 110. The second power layer 130 and the first power layer 120 may each include at least one patch having a square shape and at least one branch having a thin and long rectangular shape.

The at least one first patch 121 is an impedance patch having a lowest characteristic impedance. The at least one first branch 122 is an impedance branch having a lower characteristic impedance than the at least one second branch 132.

The at least one second patch 131 is an impedance patch having a highest characteristic impedance. The at least one second branch 132 is an impedance branch having a higher characteristic impedance than the at least one first branch 122.

For example, the at least one square first patch 121 of the first power layer 120 having the lowest characteristic impedance may be defined as a low impedance patch. The at least one first branch 122 in a thin and long rectangular shape may be defined as a low impedance branch.

The at least one second patch 131 of the second power layer 130 having the highest characteristic impedance may be defined as a high impedance patch. The at least one second branch 132 in a thin and long rectangular shape may be defined as a high impedance branch.

The at least one first patch 121 and the at least one second patch 131 may be vertically connected through a via 40. The at least one first patch 121 and the at least one second patch 131 may be disposed not to overlap on a 2-dimensional (2D) plane which is perpendicular to the via 40. The ground layer 110 may include a clearance hole 150. The via 40 may be received in the clearance hole 150.

The at least one first patch 121 and the at least one first branch 122 may have different widths from each other. The at least one second patch 131 and the at least one second branch 132 may have different widths from each other.

Figure 2:
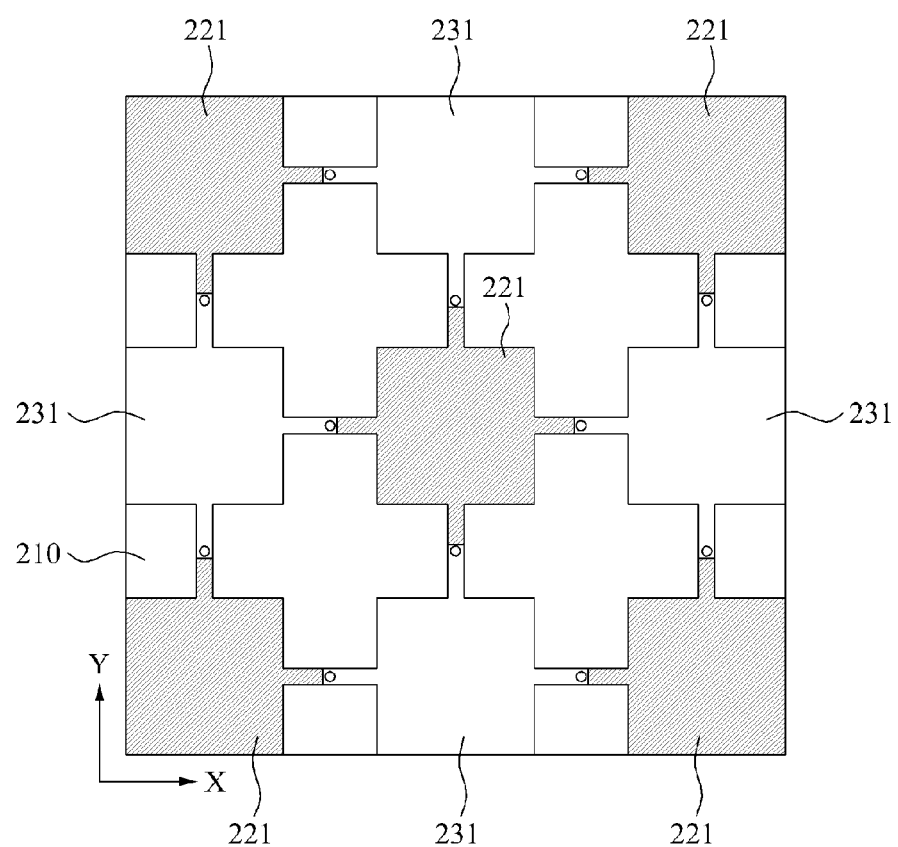
FIG. 2 is a diagram illustrating a 2-dimensional (2D) plane of an electromagnetic bandgap structure according to an embodiment of the present invention.

FIG. 2 is a diagram illustrating a 2-dimensional (2D) plane of an electromagnetic bandgap structure according to an embodiment of the present invention.

Referring to FIG. 2, the electromagnetic bandgap structure may include 3×3 cells disposed on a ground layer 210. The electromagnetic bandgap structure may be configured such that branches are adjacent to patches 221 and 231 disposed on different layers periodically in both an X-axis direction and a Y-axis direction. Since the patches 221 and 231 and the branches have different widths on a power layer, the characteristic impedance of parallel plates propagating noise may be varied.

For example, with respect to parallel plates being at a same height, the characteristic impedance is decreased according to an increase in width. Therefore, in general, branches have a relatively higher characteristic impedance while patches have a relatively lower characteristic impedance. Consequently, an impedance change may be generated between the patches 221 and 231 and the branches.

With respect to power layers being on different layers, the characteristic impedance may be decreased according to a decrease in height of the parallel plates. Therefore, branches on a first power layer have a lower characteristic impedance than branches on a second power layer. Consequently, an impedance change may be generated between the branches of different layers.

In the electromagnetic bandgap structure, an impedance change by the width is generated on the same layer and an impedance change by the height is generated on different layers. Therefore, the electromagnetic bandgap structure may have electromagnetic bandgap characteristics which prevent propagation of noise. In addition, since the impedance change according to the height and the impedance change according to the width between the power layer and the ground layer are simultaneously generated, a bandgap start frequency may be reduced while a bandwidth of the bandgap may be considerably increased.

Figure 3:
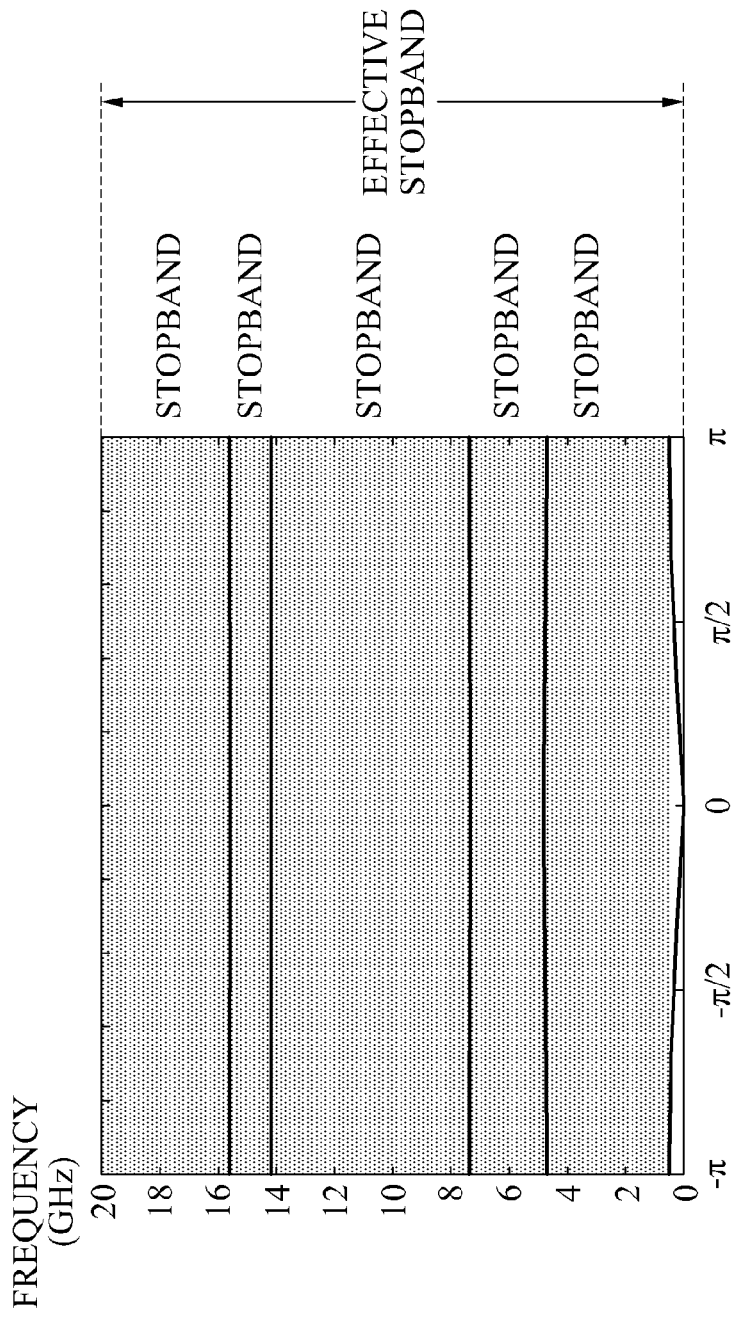
FIG. 3 is a diagram illustrating a degree of dispersion of an electromagnetic bandgap structure according to an embodiment of the present invention.

FIG. 3 is a diagram illustrating a degree of dispersion of an electromagnetic bandgap structure according to an embodiment of the present invention.

Referring to FIG. 3, in the electromagnetic bandgap structure, a bandwidth of a passband present between stopbands, which is tens of MHz, is much narrower than a bandwidth of a passband, which is several GHz. Therefore, a noise isolation bandwidth of a wide band may be formed equivalently.

Figure 4:
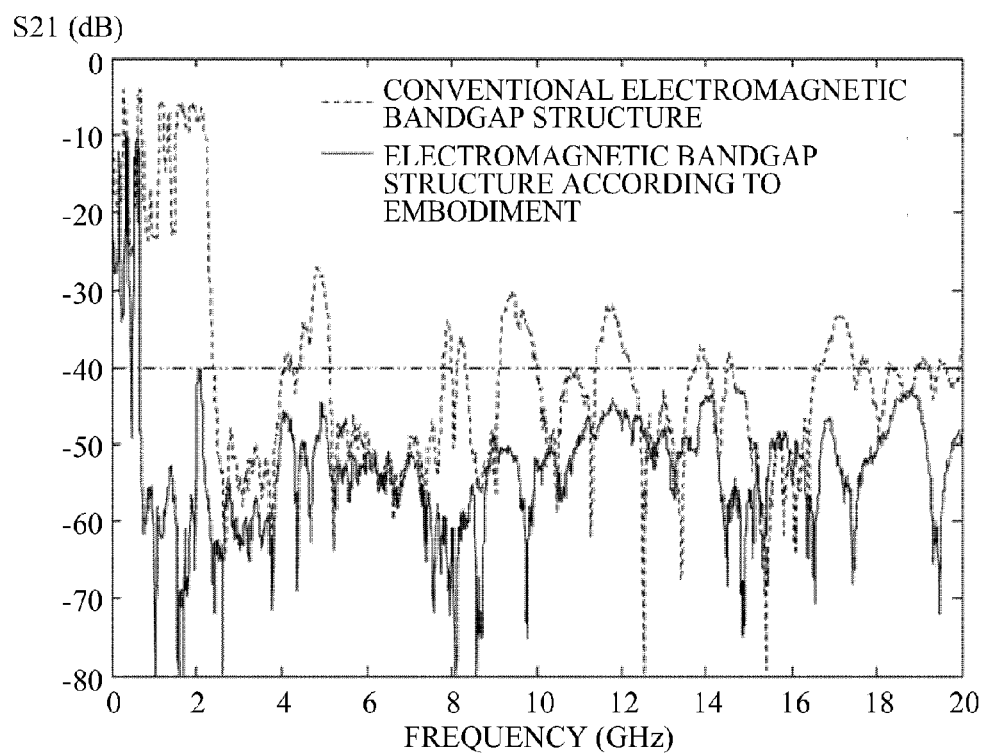
FIG. 4 is a graph illustrating a result of measuring noise attenuation characteristics of an electromagnetic bandgap structure, according to an embodiment of the present invention.

FIG. 4 is a graph illustrating a result of measuring noise attenuation characteristics of an electromagnetic bandgap structure, according to an embodiment of the present invention.

Referring to FIG. 4, a PCB including the electromagnetic bandgap structure according to the embodiment of the present invention may form a noise isolation bandwidth of a relatively wideband in comparison to a conventional electromagnetic bandgap structure.

Figure 5:
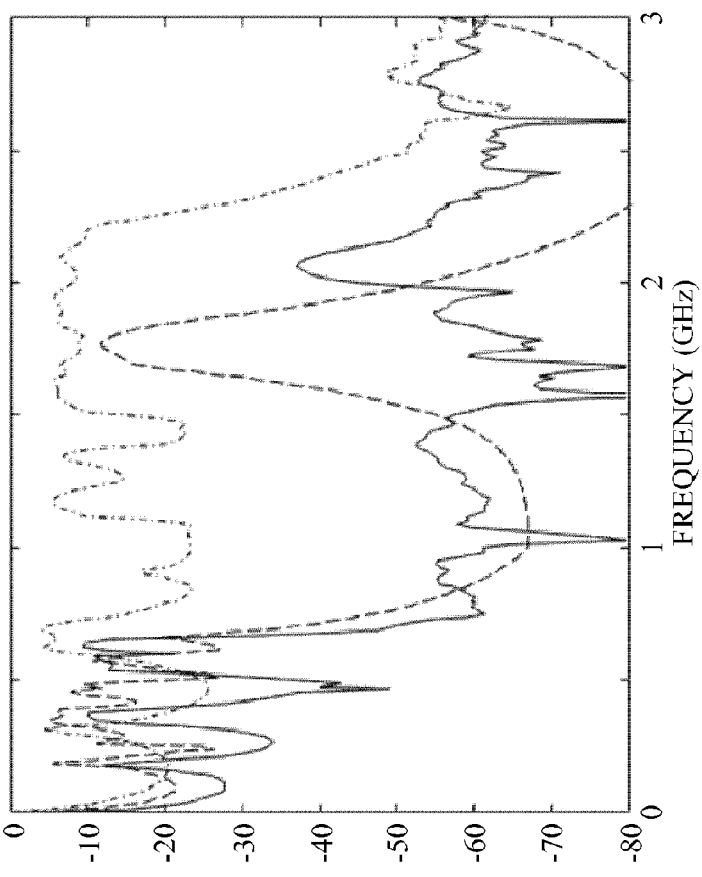
FIG. 5 is a graph illustrating a result of comparing bandgap start frequencies of an electromagnetic bandgap structure according to an embodiment of the present invention.

FIG. 5 is a graph illustrating a result of comparing bandgap start frequencies of an electromagnetic bandgap structure according to an embodiment of the present invention.

Referring to FIG. 5, the electromagnetic bandgap structure may reduce a frequency at which the bandgap starts, by about 73% of a bandgap start frequency of the conventional electromagnetic bandgap structure. In addition, with reference to the same start frequency, the electromagnetic bandgap structure according to the embodiment of the present invention may be reduced in size by about 86% of the conventional electromagnetic bandgap structure. That is, the electromagnetic bandgap structure may achieve both a small size and a wide band and may be easily implemented on a PCB.

The PCB including the electromagnetic bandgap structure may include a ground layer, a first power layer facing an upper portion of the ground layer with a dielectric interposed and including at least one first patch and at least one first branch, and a second power layer facing an upper portion of the first power layer 120 with a dielectric interposed and including at least one second patch 131 and at least one second branch 132.

Figure 6:
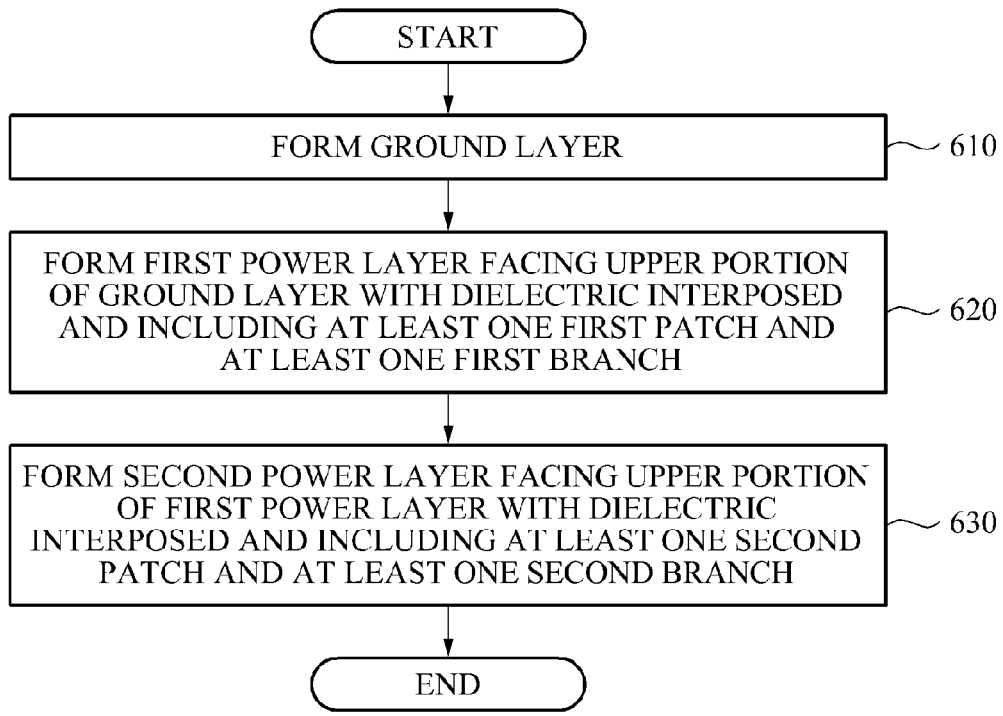
FIG. 6 is a flowchart illustrating a method of manufacturing an electromagnetic bandgap structure according to an embodiment of the present invention.

FIG. 6 is a flowchart illustrating a method of manufacturing an electromagnetic bandgap structure according to an embodiment of the present invention.

Referring to FIG. 6, the electromagnetic bandgap structure may be manufactured by a method including forming a ground layer in operation 610, forming a first power layer including at least one first patch and at least one first branch to face an upper portion of the ground layer with a dielectric interposed in operation 620, and forming a second power layer including at least one second patch and at least one second branch to face an upper portion of the first power layer with a dielectric interposed in operation 630.

The electromagnetic bandgap structure may isolate a noise being distributed using a PDN in the form of a parallel plate waveguide disposed on a PCB, thereby enabling stable operation of a system.

Furthermore, since the electromagnetic bandgap structure achieves a small size and a wideband of the noise isolation frequency, reliability of a system in which digital signals, analog signals, and RF signals are mixed may be greatly increased. Also, since the electromagnetic bandgap structure may be implemented on a PCB, price competitiveness may be increased.

According to the embodiment of the present invention, an electromagnetic bandgap structure satisfying both a low isolation start frequency and wideband noise isolation characteristics and a PCB including the electromagnetic bandgap structure may be provided.

According to the embodiment of the present invention, since a noise being propagated is isolated using a PDN in the form of a parallel plate waveguide disposed on a PCB, stable operation of a system may be guaranteed.

According to the embodiment of the present invention, since a small size and a wideband of the noise isolation frequency are simultaneously met, reliability in a system in which digital signals, analog signals, and RF signals are mixed may be increased. Also, since the electromagnetic bandgap structure may be implemented on a PCB, price competitiveness may be increased.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An electromagnetic bandgap structure comprising:
 a ground layer;
 a first power layer facing an upper portion of the ground layer with a dielectric interposed and comprising at least one first patch and at least one first branch; and
 a second power layer facing an upper portion of the first power layer with a dielectric interposed and comprising at least one second patch and at least one second branch,
 wherein the at least one first patch is an impedance patch having a lowest characteristic impedance, and
 wherein the at least one first branch is an impedance branch having a lower characteristic impedance than the at least one second branch.

2. The electromagnetic bandgap structure of claim 1, wherein the at least one first patch and the at least one second patch are provided in a square shape.

3. The electromagnetic bandgap structure of claim 1, wherein the at least one first branch and the at least one second branch are provided in a rectangular shape.

4. The electromagnetic bandgap structure of claim 1, wherein
 the at least one second patch is an impedance patch having a highest characteristic impedance, and
 the at least one second branch is an impedance branch having a higher characteristic impedance than the at least one first branch.

5. The electromagnetic bandgap structure of claim 1, wherein the at least one first patch and the at least one second patch are vertically connected through a via.

6. The electromagnetic bandgap structure of claim 5, wherein the at least one first patch and the at least one second patch are disposed not to overlap on a 2-dimensional (2D) plane which is perpendicular to the via.

7. The electromagnetic bandgap structure of claim 5, wherein
 the ground layer comprises a clearance hole, and
 the via is received in the clearance hole.

8. The electromagnetic bandgap structure of claim 1, wherein
 the at least one first patch and the at least one first branch have different widths, and
 the at least one second patch and the at least one second branch have different widths.

9. A printed circuit board (PCB) including an electromagnetic bandgap structure, the PCB comprising:
 a ground layer;
 a first power layer facing an upper portion of the ground layer with a dielectric interposed and comprising at least one first patch and at least one first branch; and
 a second power layer facing an upper portion of the first power layer with a dielectric interposed and comprising at least one second patch and at least one second branch,
 wherein the at least one first patch is an impedance patch having a lowest characteristic impedance, and
 wherein the at least one first branch is an impedance branch having a lower characteristic impedance than the at least one second branch.

10. A method of manufacturing an electromagnetic bandgap structure, the method comprising:
 forming a ground layer;
 forming a first power layer facing an upper portion of the ground layer with a dielectric interposed and comprising at least one first patch and at least one first branch; and forming a second power layer facing an upper portion of the first power layer with a dielectric interposed and comprising at least one second patch and at least one second branch, wherein the at least one first patch is an impedance patch having a lowest characteristic impedance, and wherein the at least one first branch is an impedance branch having a lower characteristic impedance than the at least one second branch.

11. The method of claim 10, wherein the at least one first patch and the at least one second patch are provided in a square shape.

12. The method of claim 10, wherein the at least one first branch and the at least one second branch are provided in a rectangular shape.

13. The method of claim 10, wherein the at least one second patch is an impedance patch having a highest characteristic impedance, and the at least one second branch is an impedance branch having a higher characteristic impedance than the at least one first branch.

14. The method of claim 10, wherein the at least one first patch and the at least one second patch are vertically connected through a via.

15. The method of claim 14, wherein the at least one first patch and the at least one second patch are disposed not to overlap on a 2-dimensional (2D) plane which is perpendicular to the via.

16. The method of claim 14, wherein the ground layer comprises a clearance hole, and the via is received in the clearance hole.

17. The method of claim 10, wherein the at least one first patch and the at least one first branch have different widths, and the at least one second patch and the at least one second branch have different widths.

* * * * *